US010389341B1

(12) United States Patent
Teh

(10) Patent No.: US 10,389,341 B1
(45) Date of Patent: Aug. 20, 2019

(54) SYNCHRONIZE-ABLE MODULAR PHYSICAL LAYER ARCHITECTURE FOR SCALABLE INTERFACE

(71) Applicant: ALTERA CORPORATION, San Jose, CA (US)

(72) Inventor: Chee Hak Teh, Bayan Lepas (MY)

(73) Assignee: Altera Corporation, San Jose, CA (US)

(*) Notice: Subject to any disclaimer, the term of this patent is extended or adjusted under 35 U.S.C. 154(b) by 445 days.

(21) Appl. No.: 14/981,220

(22) Filed: Dec. 28, 2015

(51) Int. Cl.
H03K 5/133 (2014.01)
G06F 1/10 (2006.01)
G06F 13/40 (2006.01)
H03K 5/135 (2006.01)
H03K 5/00 (2006.01)

(52) U.S. Cl.
CPC .............. *H03K 5/133* (2013.01); *G06F 1/10* (2013.01); *G06F 13/4004* (2013.01); *G06F 13/4068* (2013.01); *H03K 5/135* (2013.01); H03K 2005/00058 (2013.01); H03K 2005/00234 (2013.01)

(58) Field of Classification Search
CPC ....... H03K 5/133; G06F 1/10; G06F 13/4004; G06F 13/4068
USPC ...................... 710/29, 36, 58, 305
See application file for complete search history.

(56) References Cited

U.S. PATENT DOCUMENTS

| 5,857,083 | A | 1/1999 | Venkat |
| 5,970,510 | A | 10/1999 | Sher et al. |
| 6,202,103 | B1 | 3/2001 | Vonbank et al. |
| 6,289,398 | B1 | 9/2001 | Stallmo et al. |
| 6,510,503 | B2 | 1/2003 | Gillingham et al. |
| 6,944,040 | B1* | 9/2005 | Khanna ................ G11C 7/1051 365/189.02 |
| 7,110,423 | B1* | 9/2006 | Sethuram ............. H04L 7/0008 370/519 |
| 7,340,705 | B1* | 3/2008 | Massabki ............ G06F 17/5027 716/111 |
| 9,705,619 | B2* | 7/2017 | House ................... H04J 3/0605 |
| 2004/0236894 | A1 | 11/2004 | Grundy et al. |
| 2007/0162669 | A1 | 7/2007 | Martin et al. |
| 2013/0195235 | A1* | 8/2013 | Ferris ....................... G06F 1/10 375/362 |
| 2014/0123148 | A1* | 5/2014 | Kuechler ............ G06F 15/8015 718/102 |
| 2015/0110162 | A1* | 4/2015 | Van Den Bosch ...... H04B 1/38 375/219 |

* cited by examiner

Primary Examiner — Farley Abad
Assistant Examiner — Henry W Yu

(57) ABSTRACT

One embodiment relates to an integrated circuit with an array of modular physical layer (PHY) slice circuits that are configured into multiple synchronous groups. Each synchronous group receives a delayed synchronous pulse signal provided by a chain of synchronous delay circuits. Another embodiment relates to an array of modular PHY slice circuits, each of which includes a manager circuit that manages the modular PHY slice circuit, a remap circuit that remaps interconnect redundancy, and an input-output module that provides outbound control and data streams and receives inbound control and data streams.

10 Claims, 8 Drawing Sheets

FIG. 4   IO Module (IOM) Manager

SYNCHRONIZE-ABLE MODULAR PHYSICAL LAYER ARCHITECTURE FOR SCALABLE INTERFACE

BACKGROUND

Technical Field

The present invention relates generally to electronic interfaces, such as memory interfaces, for example.

Description of the Background Art

Programmable devices, such as field programmable gate arrays (FPGAs), typically include a programmable device core and one or more input/output (IO) banks. The programmable device core includes thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Programmable devices include one or more IO banks for communication with external devices, such as memory devices, network interfaces, data buses and data bus controllers, microprocessors, other programmable devices, ASICs, or any other type of electronic device. Each IO bank is connected with a number of conductive IO pins, balls, or other electrical connectors in the programmable device chip package. An IO bank includes logic for sending and receiving data signals, control signals, clock signals, power and ground signals, or any other type of signal used in conjunction with communications between the programmable device and an external device.

The IO banks of a programmable device include logic, amplifiers, filters, and other circuits that together can be configured to provide one or more standard interfaces between the programmable device and external devices. Additionally, the I/O banks of a programmable device can be configured to provide custom or proprietary interfaces if required by a particular application.

Memory interfaces are one type of interface that can be implemented with programmable devices. Memory interfaces include high-bandwidth memory interfaces, which are high-performance interfaces to random access memory (RAM), particularly to stacked RAM.

SUMMARY

The present disclosure provides a synchronize-able modular physical layer (PHY) architecture for a scalable interface. The scalable interface may be advantageously utilized for a high-bandwidth memory interface, for example.

One embodiment of the presently-disclosed invention relates to an integrated circuit with an array of modular PHY slice circuits that are configured into multiple synchronous groups. Each synchronous group receives a delayed synchronous pulse signal provided by a chain of synchronous delay circuits.

Another embodiment relates to an array of modular PHY slice circuits, each of which includes a manager circuit that manages the modular PHY slice circuit, a remap circuit that remaps interconnect redundancy, and an input-output module that provides outbound control and data streams and receives inbound control and data streams.

Another embodiment relates to a method of electronically configuring an array of physical layer IO modules. Synchronous groups are formed, each synchronous group being a grouping of consecutive IO modules in the array. A chain of synchronous delay modules is electronically configured such that each synchronous group receives a delayed synchronous pulse signal from one of the synchronous delay modules in the chain. In an exemplary method, one IO module of each synchronous group is electronically configured to transmit and receive address/command words and remaining IO modules of each synchronous group are electronically configured to transmit and receive data words.

Another embodiment relates to a method of managing an input-output module in a synchronous group. Upon receipt of a synchronous pulse, values written into an outbound control memory-mapped register are copied to an outbound control static buffer. In addition, values written into an outbound control select memory-mapped register are copied to an outbound control stream selector to select a source of an outbound control stream. Similar steps may be performed for the outbound data stream and the inbound control stream.

Other embodiments, aspects, and features are also disclosed.

DETAILED DESCRIPTION

Figure 1:
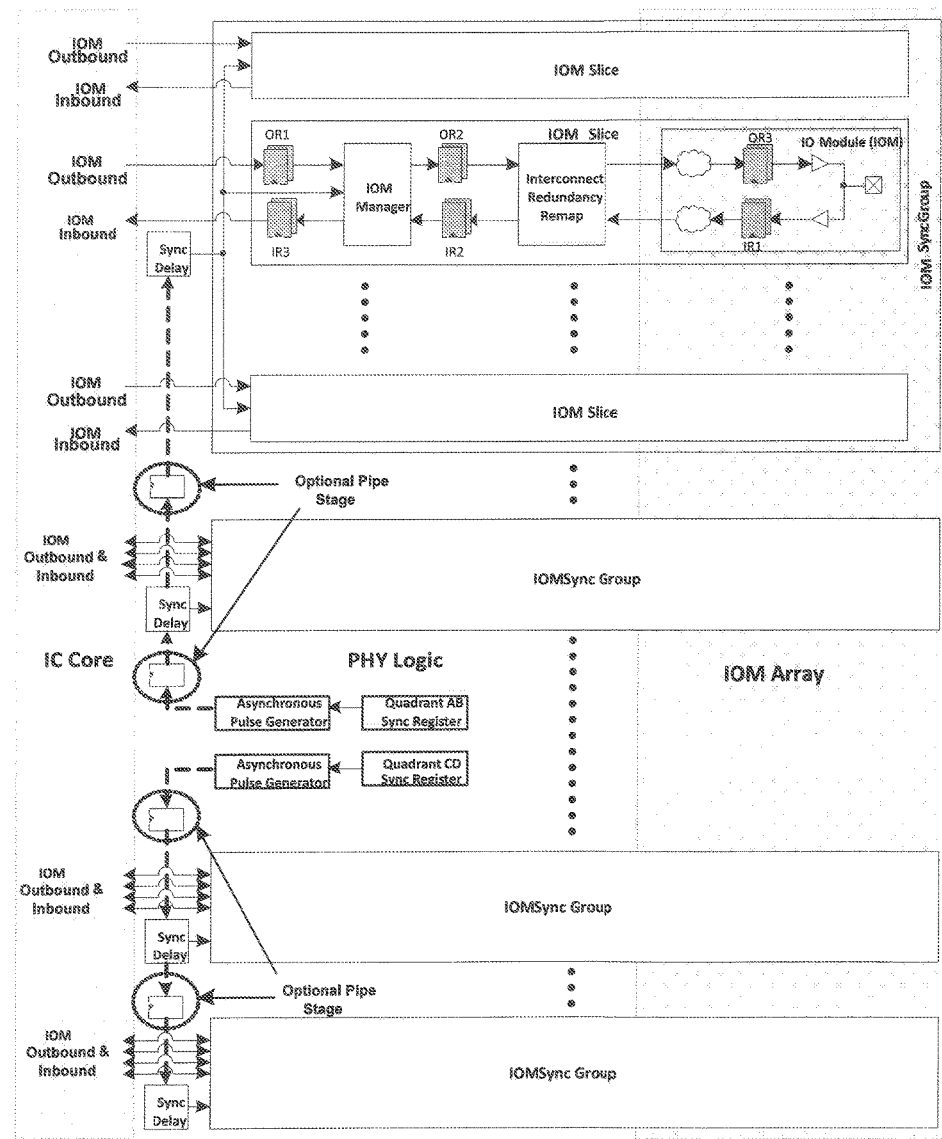
FIG. 1 depicts a synchronize-able modular PHY circuit architecture in accordance with an embodiment of the invention.

The present disclosure provides a modular PHY architecture that supports bonding and synchronizing across multiple IO modules. The modular PHY architecture is protocol agnostic in that it may be utilized to implement various different protocols.

For example, the modular PHY architecture may bond and synchronize IO modules across any quadrant within a Universal Interface Bus (UIB) to form different memory channels. Flexibility is provided to accelerate the initialization and training of the interconnect of any device attached to the other side of the UIB.

The modular PHY architecture provides the following benefits and advantages. High-speed synchronization is provided for across modular PHY blocks via pipelining to ease timing closure across wide interfaces. Hence, electronic configuration (programming) of the sequence is allowed to be in a different clock domain (that can be much slower than the channel's clock) without propagating the asynchronous nature into the channel.

In addition, each IO module slice (IOM Slice) may be mapped as either a DWORD (a data word used for data transfers) or an AWORD (an address or command word used for address or command transfers) to form a channel for a memory protocol, where the desired patterns of the AWORD and DWORD are programmed by the configuration master in accordance with the memory protocol. Furthermore, late-binding memory protocol updates (for example, translations to different patterns being programmed) may be permitted and implemented.

The present disclosure also provides a micro-architecture of an IO Module Manager. The micro-architecture is memory protocol agnostic. Each IO Module Manager may be programmed as either a DWORD or an AWORD and is useable in tandem with other IO Module managers to form a memory interface that is compliant with a variety of memory protocols.

The micro-architecture of the IO Module Manager includes stream buffers and static buffers. The stream buffers and the static buffers have complementary capabilities. The static buffers may be utilized to drive an idle state, while active memory cycles may be constructed by programming patterns into the stream buffers and programming controls so as to drive the output from the stream buffers. The micro-architecture of the IO Module Manager also allows programming of the inbound stream buffer to drain the IO module's input FIFO for read data.

In one use case, a configuration master may first program the desired patterns and controls to be sequenced or read into the Static and Stream Buffer MMRs. This includes programming the relative delays between the outbound and inbound streams. The configuration master may then write a value of logical one into the Sync Register to generate the Sync Pulse that will be pipelined and re-synchronized to each IOM Slice. (This allows for synchronization across many IOM Slices to form a memory channel for high-bandwidth memory, for example.) The re-synchronized Sync Pulse triggers synchronous copies of the desired pattern to be driven out or controlled.

In an exemplary usage model, one IOM Slice may be programmed for an AWORD and one or more IOM Slice(s) may be programmed for DWORDs. These IOM Slices may then be used in tandem to initialize and train the interconnect for a device attached to the interface (such as a 2.5D device attached to a UIB, for example). The command or pattern to be sent out for initialization, or to initialize a training sequence, is programmed into the Stream Buffer MMR of the IOM Manager mapped as an AWORD, and the data or pattern to be sent out for training is programmed into the Stream Buffer MMR of the IOM Manager(s) mapped as DWORDs. (The expected read data may be drained by programming the control pattern into the inbound control of the Stream Buffer MMR of the IOM Manager(s) mapped as DWORDs.)

In this usage model, the write latency of the memory protocol may be programmed into the outbound Sync Delay block of the IOM Manager(s) mapped as DWORDs, while the read latency and sampling uncertainty of the memory protocol may be programmed into the inbound Sync Delay block of the IOM Managers mapped as DWORDs. The sequence will only be streamed out when the Sync Register is written.

FIG. 1 depicts a synchronize-able modular PHY circuit architecture in accordance with an embodiment of the invention. The embodiment depicted includes an array of IO modules (IOM) of a universal interface bus (UIB). Other interfaces, besides a UIB, may also be implemented using the synchronize-able modular PHY circuit architecture.

Depicted in FIG. 1 are multiple synchronous groups of IO modules (IOM SyncGroups). Each IOM Sync Group is a logical grouping of one or more IO module slices (IOM Slices). Each IOM Slice in an IOM Sync Group is clocked by the same physical layer (PHY) clock signal.

Each IOM Slice is an independent circuit structure that may be independently configured and independently controlled via its own outbound and inbound signals (IOM Outbound and IOM Inbound). Within each IOM Slice is an IO module manager (IOM Manager), a remap module (Interconnect Redundancy Remap), and an IO module (IOM).

The IOM Outbound signals (both Control and Data) may be transferred from a core of the integrated circuit (IC Core, such as, for example, the core fabric of an FPGA) via pipeline registers (OR1) to the IOM Manager, then transferred via pipeline registers (OR2) to the Interconnect Redundancy Remap circuit, then transferred via further processing circuitry (cloud depiction) and pipeline registers (OR2) to the IO module. The IOM Inbound signals (both Control and Data) may be transferred from the IOM module via pipeline registers (IR1) and further processing circuitry (cloud depiction) to the Interconnect Redundancy Remap circuit, then transferred via pipeline registers (IR2) to the IOM Manager, then transferred via pipeline registers (IR3) to the core of the integrated circuit (for example, the core fabric of an FPGA).

Further depicted in FIG. 1 are two chains (a first for Quadrant AB of a UIB and a second for Quadrant CD of the UIB) of synchronous delay (Sync Delay) circuits or blocks. While two chains are depicted, other embodiments may use a different number of chains, such as one chain, three chains, four chains, and so on. Each chain of Sync Delay circuits is electronically configured so as to receive a synchronous pulse (sync_pulse_in) signal and delay it so as to provide a delayed synchronous pulse (sync_pulse_dly) signal to a corresponding IOM Sync Group. Each Sync Delay circuit may also output the synchronous pulse (sync_pulse_out) signal forward to a next Sync Delay circuit in the chain.

As further depicted, the Sync Pulse chain may be optionally pipelined to the Sync Delay blocks using optional pipeline stage (Optional Pipe Stage) registers. If provided, each Optional Pipe Stage register is clocked by the PHY clock signal and arranged before a Sync Delay block. Such pipelining may be needed for timing closure.

Two Asynchronous Pulse Generators are depicted in FIG. 1: one for the PHY clock domain of Quadrant AB; and another for the PHY clock domain of Quadrant CD. In accordance with an embodiment of the invention, a single Asynchronous Pulse Generator is used per PHY clock domain. Each Asynchronous Pulse Generator translates a write to a synchronous register (Sync Register) in the system clock domain into a synchronous pulse signal (sync_pulse) in the PHY clock domain. In an exemplary implementation, twice the frequency of the system clock is less than the frequency of the PHY clock (i.e. $2 \times F_{SYS} < F_{PHY}$). In other words, the system clock may be run at a frequency slower than half the frequency of the PHY clock in an exemplary implementation. Half the frequency of the system clock is contemplated to be a typical upper limit as to how fast some embodiments would run the system clock without any issues.

Each individual Sync Delay block may be configured with the appropriate delay setting to compensate for latency needed to reach the last Sync Delay block in the chain. For example, if there are four Sync Delay blocks in the chain without optional pipeline registers, then the delay settings may be configured as follows: the first Sync Delay block (which is closest to the Asynchronous Pulse Generator) may be configured to add a delay of four PHY clock cycles (4 $tCK_{PHY}$) to the sync_pulse_in signal that it receives; the second Sync Delay block (next in the chain) may be configured to add a delay of three PHY clock cycles (3 $tCK_{pHy}$) to the sync_pulse_in signal that it receives; the third Sync Delay block (next in the chain) may be configured to add a delay of two PHY clock cycles (2 $tCK_{PHY}$) to the sync_pulse_in signal that it receives; and the fourth Sync Delay block (last in the chain) may be configured to add a delay of one PHY clock cycle (1 $tCK_{pHy}$) to the sync_pulse_in signal that it receives. If Optional Pipe Stage registers are utilized before each Sync Delay block, then the above-described delays would be doubled.

In this way, each IOM Sync Group within a PHY clock domain will receive the synchronous pulse in the same clock. In accordance with an embodiment of the invention, receipt of the synchronous pulse functions to synchronously "trigger" each IOM Manager to apply configuration bit changes on the IOM Slice that it manages. This enables synchronized and deterministic operation of all IOM Slices connected to the same Sync Pulse chain (and, consequently, clocked by the same PHY clock).

Figure 2:
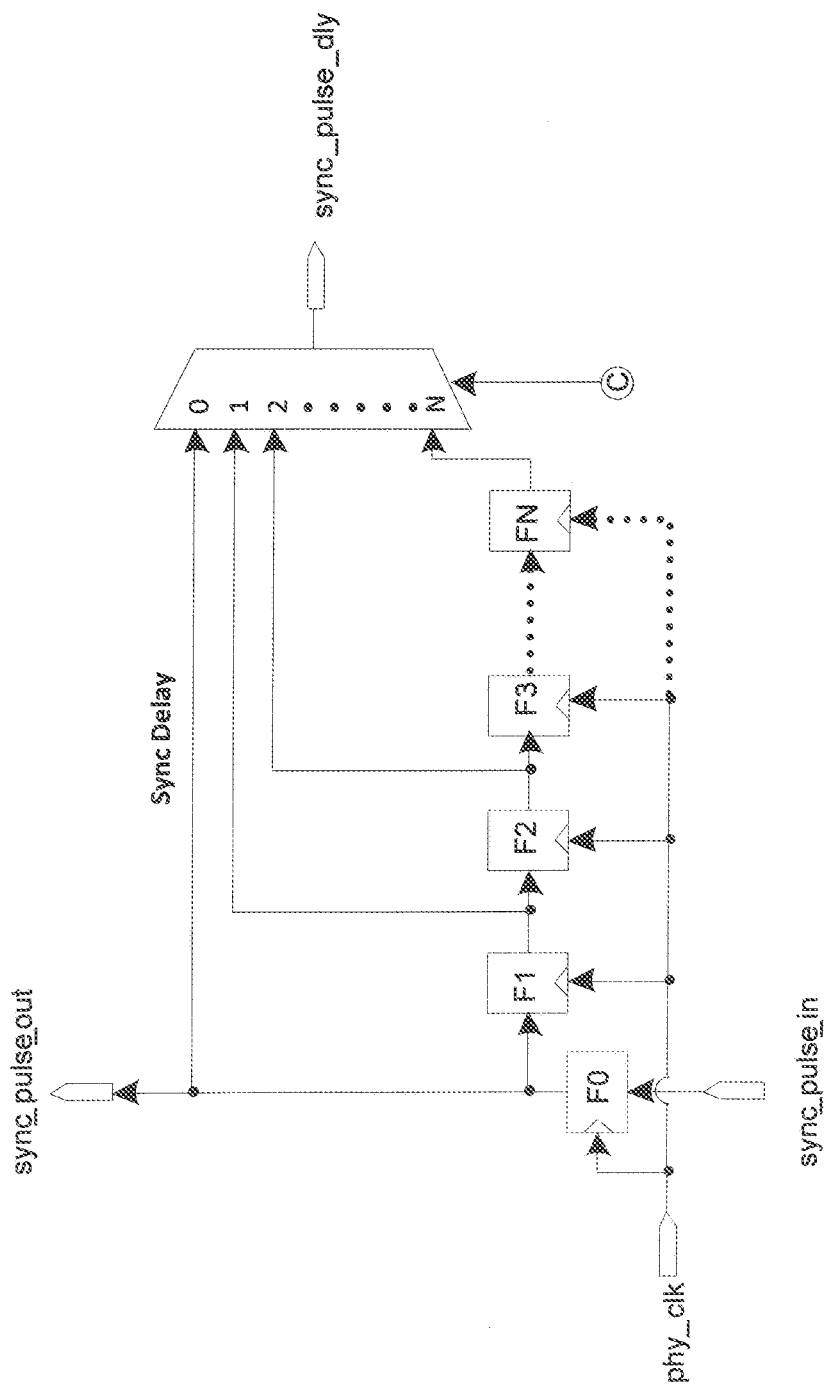
FIG. 2 depicts an exemplary implementation of a synchronous delay circuit in accordance with an embodiment of the invention.

An exemplary implementation of a synchronous delay circuit (Sync Delay block) is depicted in FIG. 2. As the implementation shown, the synchronous delay circuit includes N+1 flip-flop circuits (F0, F1, F2, F3, . . . FN) and a configurable selector circuit. The flip-flop circuits are timed using the PHY clock (phy_clk).

The Sync Pulse signal is input into F0, and the output of F0 is the output (sync_pulse_out) of the synchronous delay circuit. As can be seen, sync_pulse_out is delayed by one cycle compared with sync_pulse_in.

The outputs and inputs of the flip-flop circuits are chained together. In particular, the output of F0 is the input of F1; the output of F1 is the input of F2; the output of F2 is the input of F3; . . . ; and the output of F(N−1) is the input of FN.

The configurable selector circuit has N+1 inputs and a single output. The N+1 inputs are the outputs of the N+1 flip-flop circuits. The output is the delayed synchronous pulse signal (sync_pulse_dly) that is provided to the associated IOM Sync Group. The selector circuit is configured using configuration bit C.

Figure 3:
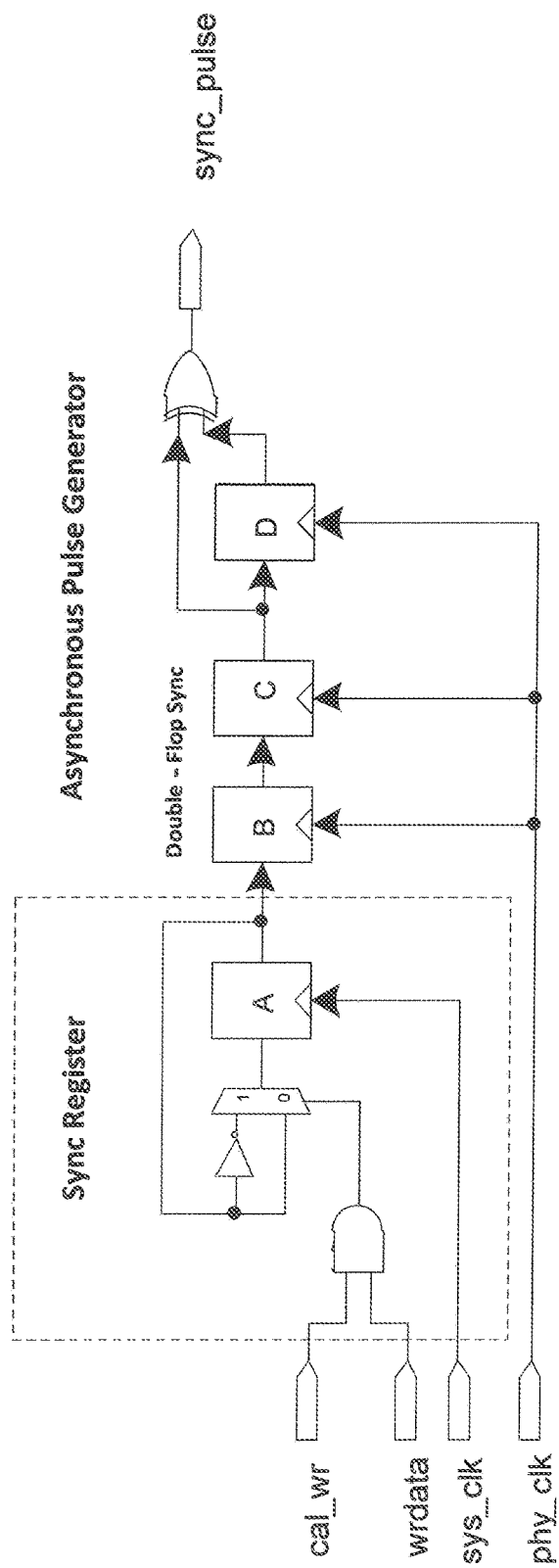
FIG. 3 depicts an exemplary implementation of a synchronous register and an asynchronous pulse generator in accordance with an embodiment of the invention.

An exemplary implementation of a synchronous register (Sync Register) and an asynchronous pulse generator (Asynchronous Pulse Generator) is depicted in FIG. 3. The Asynchronous Pulse Generator translates a write of logical one to the Sync Register in the system clock domain into a synchronous pulse signal (sync_pulse) in the PHY clock domain.

The inputs to the Sync Register are the calibration write (cal_wr) and write data (wrdata) signals and the system clock signal (sys_clk). When cal_wr is a logical one, and a logical one is written to the Sync Register via the wrdata signal, then the AND gate outputs a logical one that controls the selector circuit. The output of Flip-flop (FF) A is fed back to the "0" input of the selector and also to an inverter that feeds into the "1" input of the selector. Due to the logical one at the control of the selector circuit, the output of the selector circuit changes from zero to one, so that FF A changes from logical zero to logical one for one cycle so that a pulse is generated and output to the Asynchronous Pulse Generator.

The Asynchronous Pulse Generator receives the pulse at the input of the double FF that includes FF B and FF C, both timed using the PHY clock. The output of the double FF is provided to FF D, also timed using the PHY clock. XOR gate receives the output of FF C at its first input and the output of FF D at its second input. The output of the XOR gate is the Sync Pulse signal (sync_pulse) that is provided to the first Sync Delay block (or to the Optional Pipe Stage register, if that is present).

Figure 4:
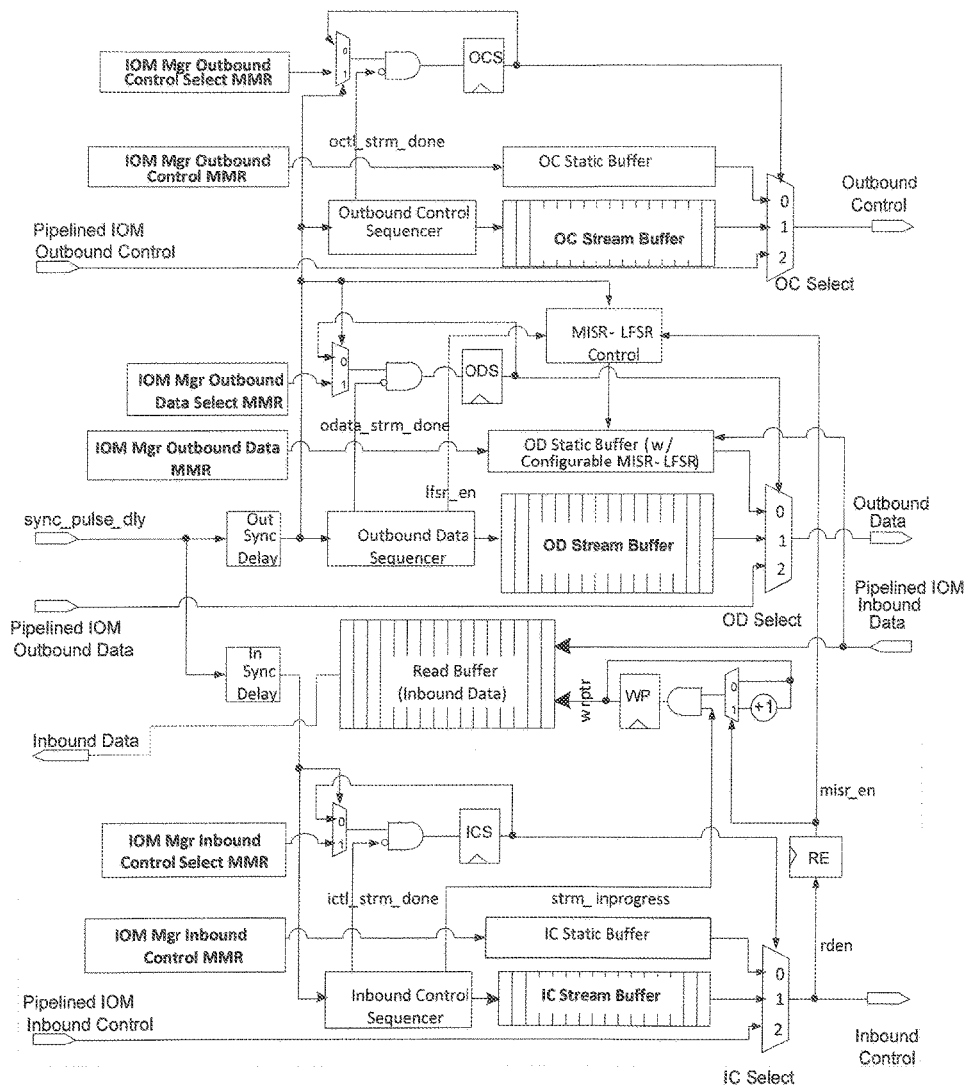
FIG. 4 depicts a IO module manager circuit in accordance with an embodiment of the invention.

FIG. 4 depicts an IO module manager (IOM Manager) block in accordance with an embodiment of the invention. Note that, in FIG. 4, the blocks timed (clocked) by the system clock are in bold letters, while the blocks timed (clocked) by the PHY clock are in non-bold letters.

As shown in FIG. 4, the IOM Manager receives pipelined outbound control and data (Pipelined IOM Outbound Control and Pipelined IOM Outbound Data) signals from the IC Core (see FIG. 1) and outputs outbound control and data (Outbound Control and Outbound Data) signals to the Interconnect Redundancy Remap block (see FIG. 1). The IOM Manager also receives pipelined inbound control and data (Pipelined IOM Inbound Control and Pipelined IOM Inbound Data) signals from the Interconnect Redundancy Remap block (see FIG. 1) and outputs the inbound control and data (Inbound Control and Inbound Data) signals to the IC Core (see FIG. 1).

The Interconnect Redundancy Remap block is responsible for functionally remapping damaged IO pins (damaged, for example, during die packaging or 2.5D flows). The Interconnect Redundancy Remap block remaps/shifts the controls/data of the respective IO pins to adjacent redundant IO pins that can be repurposed for functional IO use.

The IOM Manager provides three selectable stream sources for the Outbound Control signal. Selection of the stream source is controlled by a 3-input selector (OC Select) circuit which is controlled from the output of an outbound control selector (OCS) register. (The selector circuit may also be referred to as a stream multiplexer select circuit.) When triggered, values written into a memory-mapped register for outbound control selection for this IOM Manager (IOM Mgr Outbound Control Select MMR) may be copied (driven) into the OCS register so as to select the stream source.

In particular, as depicted, the output of the IOM Mgr Outbound Control Select MMR may be input to one input (the "1" input) of a 2-input selector, which receives the feedback output of the OCS register at its other input (the "0" input). The 2-input selector is controlled by the output of the Out Sync Delay block, and the output of the 2-input selector is provided to a first input of an AND gate. The second input of the AND gate is an inverted form of the outbound-control-stream-done (octl_strm_done) control signal from the Outbound Control Sequencer, and the output of the AND gate is the input to the OCS register. The above-described circuitry provides for synchronous switching of the source of the outbound control from the static buffer to the stream buffer upon the trigger and also to synchronously switch back from the stream buffer to the static buffer when the stream is done.

A first selectable source for the Outbound Control signal is a static buffer (OC Static Buffer). When triggered, values written into a memory-mapped register for outbound control signals for this IOM Manager (IOM Mgr Outbound Control MMR) are copied (driven) into the OC Static Buffer. The OC Static Buffer may be the default source upon reset.

A second selectable source for the Outbound Control signal is a stream buffer (OC Stream Buffer), which may be a memory-mapped register (MMR) that is a circular first-in-first-out (FIFO) buffer. The control for the OC Stream Buffer is provided by an Outbound Control Sequencer, and the input for the Outbound Control Sequencer is provided by the sync_pulse_dly signal, which may be delayed by the an outbound sync delay circuit (Out Sync Delay). The Out Sync Delay circuit is configurable to provide fine tuning of when the outbound stream buffers (OC Stream Buffer and OD Stream Buffer) will start streaming.

A third selectable source for the Outbound Control signal is the pipelined IOM Outbound Control signal. As discussed above, this signal is received from (driven by) the IC Core.

Similarly, the IOM Manager provides three selectable stream sources for the Outbound Data signal. Selection of the stream source is controlled by a 3-input selector (OD Select) circuit which is controlled from the output of an outbound data selector (ODS) register. When triggered, values written into a memory-mapped register for outbound data selection for this IOM Manager (IOM Mgr Outbound Data Select MMR) may be copied (driven) into the ODS register so as to select the stream source.

In particular, as depicted, the output of the IOM Mgr Outbound Data Select MMR may be input to one input (the "1" input) of a 2-input selector, which receives the fedback output of the ODS register at its other input (the "0" input). The 2-input selector is controlled by the output of the Out Sync Delay block, and the output of the 2-input selector is provided to a first input of an AND gate. The second input of the AND gate is an inverted form of the outbound-data-stream-done (odata_strm_done) control signal from the Outbound Data Sequencer, and the output of the AND gate is the input to the ODS register. The above-described circuitry provides for synchronous switching of the source of the outbound data from the static buffer to the stream buffer upon the trigger and also to synchronously switch back from the stream buffer to the static buffer when the stream is done.

A first selectable source for the Outbound Data signal is a static buffer (OD Static Buffer), which may have a configurable option for a multiple input signature register-linear feedback shift register (MISR-LFSR) on the data path. When triggered, values written into a memory-mapped register for outbound data signals for this IOM Manager (IOM Mgr Outbound Data MMR) are copied (driven) into the OD Static Buffer. The data value written into the IOM Mgr Outbound Data MMR may also be the seed for the MISR or LFSR operation if the OD Static Buffer is configured in that mode. The OD Static Buffer may be the default source upon reset.

A second selectable source for the Outbound Data signal is a stream buffer (OD Stream Buffer), which may be a MMR that is a circular first-in-first-out (FIFO) buffer. The control for the OD Stream Buffer is provided by an Outbound Data Sequencer, and the input for the Outbound Data Sequencer is provided by the sync_pulse_dly signal, which may be delayed by the Out Sync Delay circuit.

A third selectable source for the Outbound Data signal is the pipelined IOM Outbound Data signal. As discussed above, this signal is received from (driven by) the IC Core.

Also similarly, the IOM Manager provides three selectable stream sources for the Inbound Control signal. Selection of the stream source is controlled by a 3-input selector (IC Select) circuit which is controlled from the output of an inbound control selector (ICS) register. When triggered, values written into a memory-mapped register for inbound control selection for this IOM Manager (IOM Mgr Inbound Control Select MMR) may be copied (driven) into the ICS register so as to select the stream source.

In particular, as depicted, the output of the IOM Mgr Inbound Control Select MMR may be input to one input (the "1" input) of a 2-input selector, which receives the fedback output of the ICS register at its other input (the "0" input). The 2-input selector is controlled by the output of the In Sync Delay block, and the output of the 2-input selector is provided to a first input of an AND gate. The second input of the AND gate is an inverted form of the inbound-control-stream-done (ictl_strm_done) control signal from the Inbound Control Sequencer, and the output of the AND gate is the input to the ICS register. The above-described circuitry provides for synchronous switching of the source for the inbound control from the static buffer to the stream buffer upon the trigger and also to synchronously switch back from the stream buffer to the static buffer when the stream is done.

A first selectable source for the Inbound Control signal is a static buffer (IC Static Buffer). When triggered, values written into a memory-mapped register for inbound control signals for this IOM Manager (IOM Mgr Inbound Control MMR) are copied (driven) into the IC Static Buffer. The IC Static Buffer may be the default source upon reset.

A second selectable source for the Inbound Control signal is a stream buffer (IC Stream Buffer), which may be a MMR that is a circular first-in-first-out (FIFO) buffer. The control for the IC Stream Buffer is provided by an Inbound Control Sequencer, and the input for the Inbound Control Sequencer is provided by the sync_pulse_dly signal, which may be delayed by the an inbound sync delay circuit (In Sync Delay). The Inbound Sync Delay circuit is configurable to provide fine tuning of when the IC Stream Buffer will start streaming.

A third selectable source for the Inbound Control signal is the pipelined IOM Inbound Control signal. As discussed above, this signal is received from (driven by) the IC Core.

The IOM Manager also provides a read buffer for inbound data (Read Buffer). The Read Buffer receives the Pipelined IOM Inbound Data from the Interconnect Redundancy Remap block. The WP register outputs the write pointer (wrptr) for the Read Buffer. The Read Buffer may be clocked by the PHY clock when written and clocked by the system clock when read.

The output from the WP register is also fed back to a first (0) input of a 2-input selector, which has its second (1) input fixed to a logical one. The 2-input selector is controlled by the misr_en signal, and the output of the 2-input selector is provided to a first input of an AND gate. The second input of the AND gate is a stream-in-progress (strm_inprogress) control signal from the Inbound Control Sequencer, and the output of the AND gate is the input to the WP register.

As further depicted in FIG. 4, a MISR-LFSR Control block may receive the synchronous pulse signal output from the Out Sync Delay block and may also receive a LFSR enable (lfsr_en) signal from the Outbound Data Sequencer and a MISR enable signal (misr_en) from a read enable (RE) register. The LFSR enable enables the OD Static Buffer to send LFSR data while the MISR enable controls the OD Static Buffer to generate the MISR signature based on the inbound data stream. The output of the MISR-LFSR Control block is provided to the OD Static Buffer.

In an exemplary method of operation, upon receipt of the synchronized Sync Pulse, values may be copied to each Static Buffer from the corresponding Control/Data MMR, and values written to the Select MMRs may be used to select the sources of the streams.

In addition, upon receipt of the synchronized Sync Pulse, each Stream Buffer may stream from its first entry to the entry pointed to by a tail pointer MMR. Each entry may also be looped M times before proceeding to the next entry within the stream, where M is greater than or equal to one. Each stream may be looped N times, where N is greater than or equal to one. Upon completion of the final loop, the corresponding stream multiplexer Select circuit may switch back and select the output of the corresponding Static Buffer.

Figure 5:
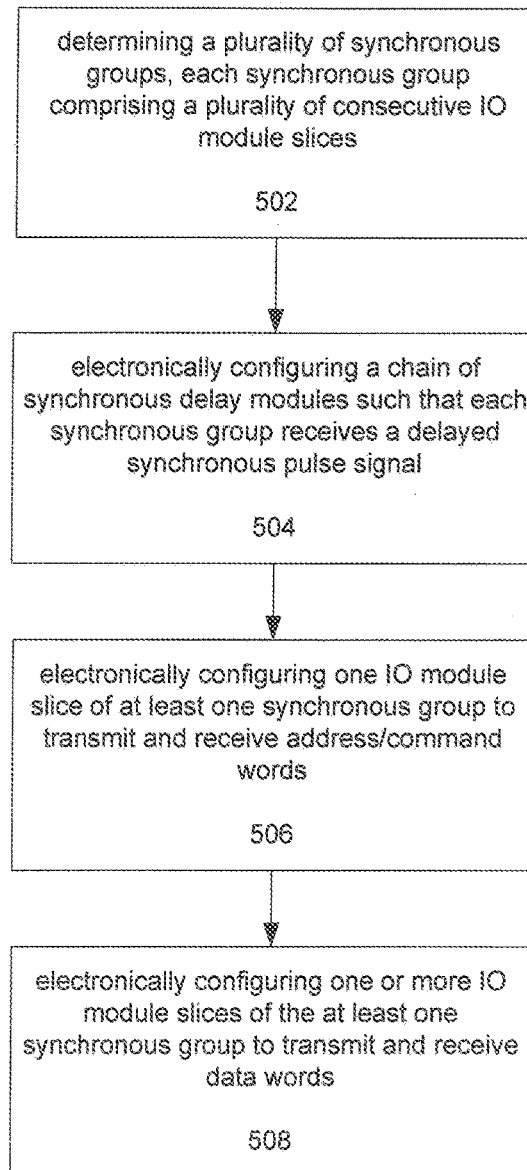
FIG. 5 is a flow chart of a method for configuring a synchronize-able modular physical layer interface in accordance with an embodiment of the invention.

FIG. 5 is a flow chart of a method 500 for configuring a synchronize-able modular physical layer interface in accordance with an embodiment of the invention. Per step 502, a determination is made of a plurality of synchronous groups, each synchronous group including a plurality of consecutive IO module slices.

Per step 504, a chain of synchronous delay modules is electronically configured. The configuration is such that each synchronous group receives a delayed synchronous pulse signal from a corresponding synchronous delay module. Per step 506, one IO module slice in at least one synchronous group is electronically configured to transmit and receive address/command words, while one or more IO module slices in the at least one synchronous group are electronically configured to transmit and receive data words.

Note that step 506 may be performed in order to electronically configure a memory channel using one or more synchronous groups connected by a chain of synchronous delay modules. Note also that more than one memory channel may be configured using the array of synchronous groups connected by a chain of synchronous delay modules.

Note that, in addition to the steps in FIG. 5, the static and stream buffers also need to be configured to hold the corresponding patterns to be driven out on the address/command and/or data IO module. If the command is for a read operation, the data IO module needs to have its inbound data control configured to drain the data received as per the interface protocol. The configured values will be streamed out when the sync pulse is received.

Figure 6:
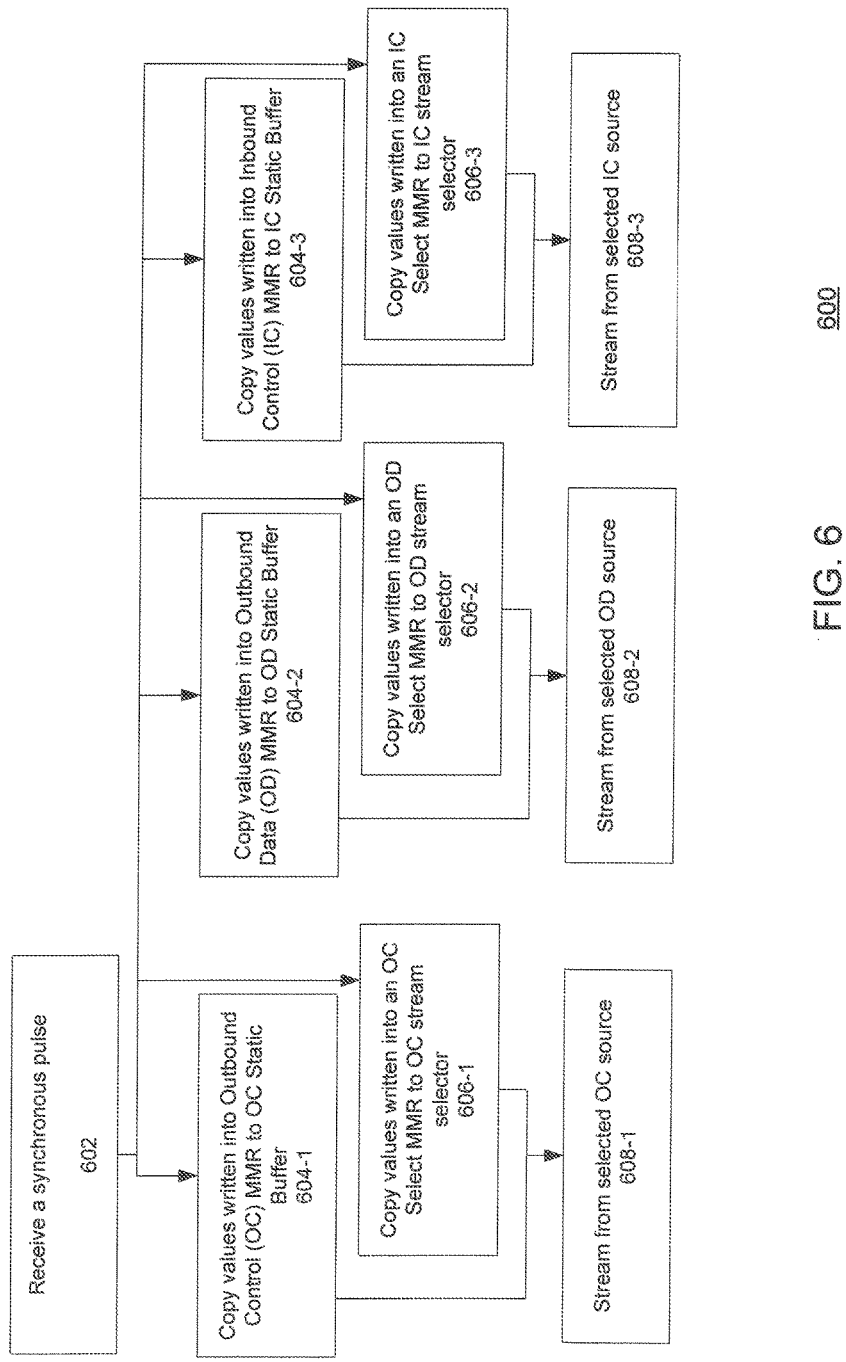
FIG. 6 is a flow chart of steps performed by an IO module manager upon receipt of a synchronous pulse signal in accordance with an embodiment of the invention.

FIG. 6 is a flow chart of a method 600 performed by an IO module manager upon receipt of a synchronous pulse signal in accordance with an embodiment of the invention. Per step 602, a synchronous pulse is received by the IO module manager. The receipt of the synchronous pulse may trigger performance of the following steps.

Per step 604-1, values written into Outbound Control (OC) MMR may be copied to OC Static Buffer. In addition, per step 606-1 values written into an OC Select MMR may be copied to OC stream selector. The OC stream selector may then be controlled, per step 608-1, to stream from the selected OC source.

Similarly, per step 604-2, values written into Outbound Data (OD) MMR may be copied to OD Static Buffer. In addition, per step 606-2 values written into an IC Select MMR may be copied to OD stream selector. The OD stream selector may then be controlled, per step 608-2, to stream from the selected OD source.

Also similarly, per step 604-3, values written into Inbound Control (IC) MMR may be copied to IC Static Buffer. In addition, per step 606-3 values written into an IC Select MMR may be copied to IC stream selector. The IC stream selector may then be controlled, per step 608-3, to stream from the selected IC source.

For example, the OC stream selector may stream from the OC Static Buffer during an idle state, and then the OC stream selector may switch to stream from the OC Stream Buffer or the Pipelined IOM OC input during an active state. The OC stream selector may then switch back to stream from the OC Static Buffer during a subsequent idle state.

Similarly, for example, the OD stream selector may stream from the OD Static Buffer during an idle state, and then the OD stream selector may switch to stream from the OD Stream Buffer or the Pipelined IOM OD input during an active state. The OD stream selector may then switch back to stream from the OD Static Buffer during a subsequent idle state.

Also similarly, for example, the IC stream selector may stream from the IC Static Buffer during an idle state, and then the IC stream selector may switch to stream from the IC Stream Buffer or the Pipelined IOM IC input during an active state. The IC stream selector may then switch back to stream from the IC Static Buffer during a subsequent idle state.

Figure 7:
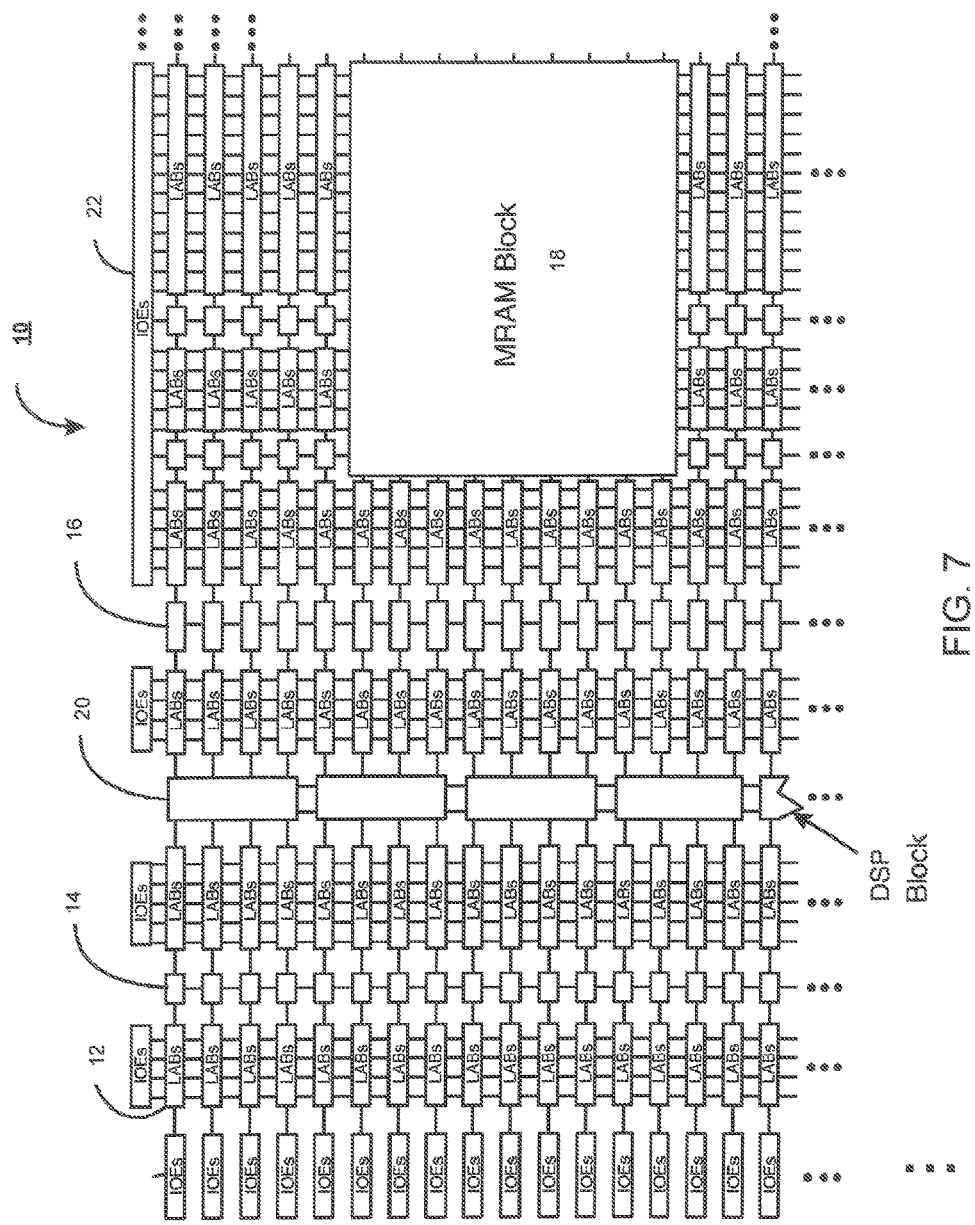
FIG. 7 is a simplified partial block diagram of a field programmable gate array that may be arranged or configured to include one or more of the circuits disclosed herein in accordance with an embodiment of the invention.

FIG. 7 is a simplified partial block diagram of a field programmable gate array (FPGA) 10 that may be arranged or configured to include one or more of the circuits disclosed herein in accordance with an embodiment of the invention. It should be understood that embodiments of the present invention may be used in numerous types of integrated circuits, including FPGAs, programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers. FPGA 10 may further include digital signal processing (DSP) blocks 20 that can implement, for example, multipliers with add or subtract features.

Input/output elements (IOEs) 22 located, in this example, around the periphery of the chip support numerous single-ended and differential input/output standards. Each IOE 22 is coupled to an external terminal (i.e., a pin) of FPGA 10.

It is to be understood that FPGA 10 is described herein for illustrative purposes only and that the present invention can be implemented in many different types of PLDs, FPGAs, and ASICs.

Figure 8:
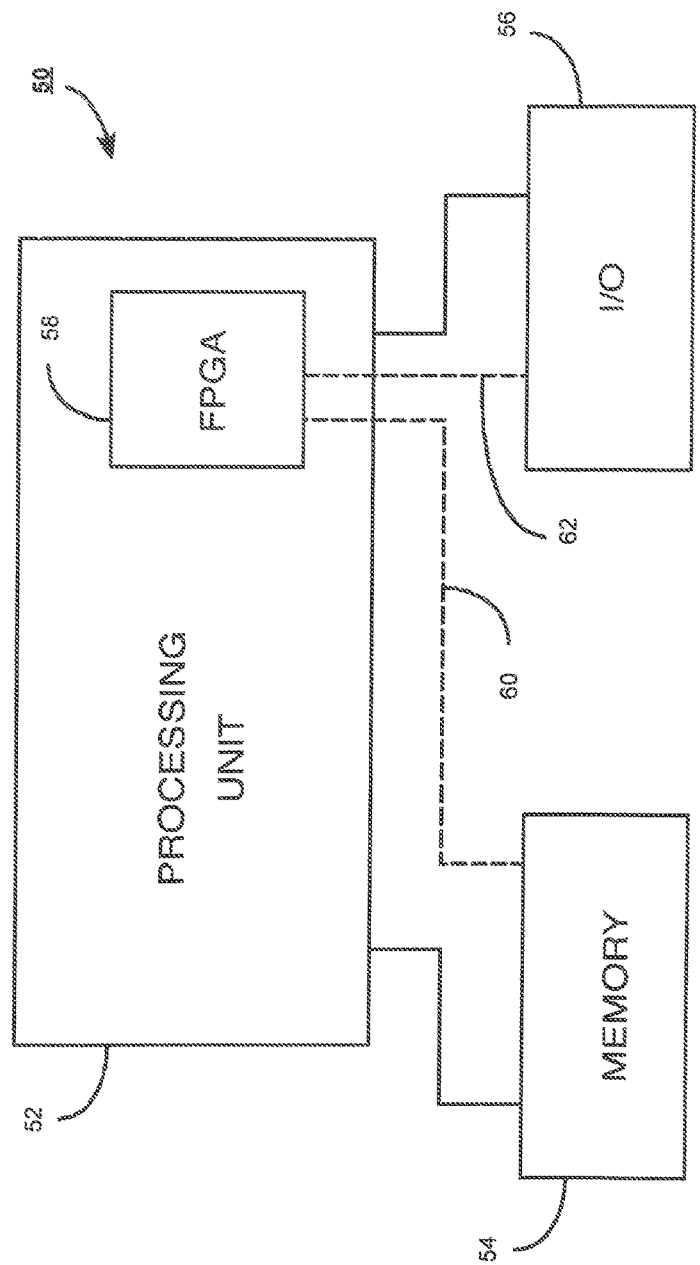
FIG. 8 is a block diagram of an exemplary digital system that may employ an embodiment of the invention.

FIG. 8 is a block diagram of an exemplary digital system 50 that may employ an embodiment of the invention. As shown, system 50 may include an FPGA as one of several components.

System 50 may be, for example, a programmed digital computer system, digital signal processing system, specialized digital switching network, or other processing system. System 50 may be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

As shown, system 50 includes a processing unit 52, a memory unit 54, and an input/output (I/O) unit 56 interconnected together by one or more buses. According to this exemplary embodiment, FPGA 58 is embedded in processing unit 52. FPGA 58 may serve many different purposes within the system 50. FPGA 58 may, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus for a physical layer (PHY) interface, the apparatus comprising:
    an array of modular PHY slice circuits;
    a plurality of synchronous groups, each synchronous group comprising a group of modular PHY slice circuits in the array; and
    a chain of synchronous delay circuits, each synchronous delay circuit receiving a synchronous pulse signal and delaying the synchronous pulse signal provided to a corresponding synchronous group.

2. The apparatus of claim 1, wherein each synchronous delay circuit in the chain is configured with an individual delay setting that determines an amount of delay applied to the synchronous pulse signal.

3. The apparatus of claim 1, further comprising:
    a synchronous register that generates a pulse upon receiving a value of logical one; and
    an asynchronous pulse generator that receives the pulse from the synchronous register and outputs the synchronous pulse signal to a first synchronous delay circuit in the chain.

4. The apparatus of claim 3, wherein the synchronous register is clocked by a system clock, and wherein the asynchronous pulse generator is clocked by a PHY clock.

5. The apparatus of claim 1, further comprising:
    a plurality of pipeline registers, each pipeline register arranged before a corresponding synchronous delay circuit in the chain, receiving the synchronous pulse signal, and outputting the synchronous pulse signal using timing provided by the PHY clock.

6. A method of electronically configuring an array of physical layer input-output (TO) modules, the method comprising:
    determining a plurality of synchronous groups, each synchronous group comprising a plurality of consecutive TO modules in the array; and
    electronically configuring a chain of synchronous delay modules such that each synchronous group receives a delayed synchronous pulse signal from one of the synchronous delay modules in the chain.

7. The method of claim 6, further comprising:
    electronically configuring one TO module of each synchronous group to transmit and receive address/command words; and
    electronically configuring remaining TO modules of each synchronous group to transmit and receive data words.

8. The method of claim 6, wherein each synchronous delay module receives a synchronous pulse signal and selects the delayed synchronous pulse for output to the synchronous group from a plurality of delayed synchronous pulse signals generated using a series of flip-flop circuit.

9. The method of claim 8, wherein the synchronous pulse signal is generated using an asynchronous pulse generator driven by a synchronous register.

10. The method of claim 9, wherein the synchronous register is clocked using a system clock, and the asynchronous pulse generator is clocked using a physical layer clock.

* * * * *